United States Patent
Furushima

(10) Patent No.: US 6,539,039 B2
(45) Date of Patent: Mar. 25, 2003

(54) OPTICAL SEMICONDUCTOR DEVICE AND METHOD OF MANUFACTURING THE SAME

(75) Inventor: Yuji Furushima, Tokyo (JP)

(73) Assignee: NEC Corporation, Tokyo (JP)

(*) Notice: Subject to any disclaimer, the term of this patent is extended or adjusted under 35 U.S.C. 154(b) by 0 days.

(21) Appl. No.: 09/832,842

(22) Filed: Apr. 12, 2001

(65) Prior Publication Data
US 2001/0030327 A1 Oct. 18, 2001

(30) Foreign Application Priority Data
Apr. 12, 2000 (JP) .......................... 2000-110614

(51) Int. Cl.[7] .............................................. H01S 5/227
(52) U.S. Cl. .................................................... 372/46
(58) Field of Search ............................................ 372/46

(56) References Cited
U.S. PATENT DOCUMENTS 5,358,898 A   10/1994  Ogita et al. ................. 437/129
5,901,265 A    5/1999  Tohyama et al. ............ 385/131
6,229,836 B1 *  5/2001  Okuda ........................... 372/48

FOREIGN PATENT DOCUMENTS

EP   0 810 462 A2   12/1997

OTHER PUBLICATIONS

Wood–Hi Cheng et al., "High–Speed 1.3 $\mu$m InGaAsP Fabry–Perot Lasers for Digital and Analog Applications," IEEE Journal of Quantum Electronics, V. 29, 1993, pp. 1660–1667.

* cited by examiner

Primary Examiner—James Davie
(74) Attorney, Agent, or Firm—Young & Thompson

(57) ABSTRACT

An optical semiconductor device is a buried hetero structure type, and includes a semi-insulating semiconductor block layer, a carrier trap layer, and a clad layer and a contact layer. Each of the clad layer and the contact layer is formed by selective growth. The carrier trap layer and the semi-insulating block layer have an etched mesa-structure.

10 Claims, 13 Drawing Sheets

OPTICAL SEMICONDUCTOR DEVICE AND METHOD OF MANUFACTURING THE SAME

BACKGROUND OF THE INVENTION

This invention broadly relates to an optical semiconductor device for use in an optical communication. In particular, this invention relates to an optical semiconductor device of a buried hetero structure type including a semi-insulating semiconductor block layer and a carrier trap layer.

Research and development have been carried out about a variety of optical semiconductor devices as light sources for use in an optical fiber communication system.

Particularly, it is becoming increasingly important to reduce device capacitance in the optical semiconductor device used for high-speed modulation of several G bit/Sec or higher.

Under such circumstance, practical use has been made about a semi-insulating buried hetero structure (hereinafter, may be referred to as a SI-BH structure) having a semi-insulating semiconductor block layer so as to largely reduce the device capacitance and further to effectively achieve a stable lateral mode oscillating characteristic.

Referring to FIG. 1, description will be made about a semiconductor laser having the SI-BH structure according to a first related art.

Generally, such a semi-insulating semiconductor block layer serves as a high resistance layer for either of electrons or holes current carriers while it does not serve as the high resistance layer for the other carriers.

To this end, the carrier trap layer is formed for the carriers, which does not serve as the high resistance layer, to enhance current constriction performance (or current narrowing performance).

In the SI-BH structure illustrated in FIG. 1, a Fe-doped InP block layer 2a is used as the semi-insulating semiconductor block layer. In this event, the Fe-doped InP block layer 2a serves as the high resistance layer for the electron current while it does not serve as the high resistance layer for the hole current.

In consequence, an Si-doped InP hole trap layer 3a is formed as a hole carrier trap layer at a p-electrode side of the Fe-doped InP block layer 2a. With such a structure, the carrier trap layer must be doped with high concentration. Consequently, resistivity is excessively lowered, and an equivalent potential surface is widened with the width of the carrier trap layer so as to increase the device capacitance.

Accordingly, a narrow mesa-structure must be formed by etching to reduce the width of the carrier trap layer in the SI-BH structure having the carrier trap layer.

In the related semiconductor laser illustrated in FIGS. 1 and 2, an etching groove reaches the n-InP substrate 1a. Consequently, the structure 10 consisting of an electrode 8b, an insulating film 7 and the InP substrate 1a is formed at the bottom of the etching groove 9a.

Thereby, an insulating layer thickness as one parameter specifying wiring capacitance is determined by only the thickness of the insulating film 7. As a result, parasitic capacitance will be Subsequently, description will be made about another optical semiconductor device according to a second related art with reference to FIG. 3.

In the related optical semiconductor device, the carrier trap layer 3a is entirely severed. Further the semi-insulating semiconductor block layer 2a is partially left. Thereby, the structure 10 consisting of the electrode 8b, the insulating film 7, the semi-insulating semiconductor block layer 2a, and the n-InP substrate 1a is formed such that the insulating layer thickness becomes the total layer thickness of the insulating film 7 and the semi-insulating semiconductor block layer 2a. In consequence, the wiring capacitance is reduced in comparison with the related optical semiconductor device illustrated in FIG. 2.

However, it is necessary to etch the layer having of the thickness of 1.5 to 2 $\mu$m or more including the clad layer in the related structure having the flat buried clad layer 4c.

Consequently, an etching depth must be controlled at high accuracy to remain the sufficient thickness of the semi-insulating semiconductor block layer 2a.

More specifically, the thickness of the buried clad layer 4c must be set to 3 to 4 $\mu$m or more so as to prevent optical electric field entering into the contact layer 5a, the insulating layer 7, the electrode 8b, and the device external portion in an optical semiconductor device having spot-size converter (SSC) waveguide layer.

In consequence, it is required that the etching depth is controlled with excessively high accuracy to remain the sufficient thickness of the semi-insulating semiconductor block layer 2a.

Further, the etching must be carried out uniformly, and each semiconductor layer must have a uniform thickness.

SUMMARY OF THE INVENTION

It is therefore an object of this invention to provide an optical semiconductor device which has lower device capacitance and is suitable for high-speed transmission and which is capable of manufacturing the optical semiconductor device with excellent repeatability.

According to this invention, an optical semiconductor device is a buried hetero structure type.

With this structure, the optical semiconductor device includes a semi-insulating semiconductor block layer, a carrier trap layer, and a clad layer and a contact layer. Herein, each of the clad layer and the contact layer is formed by selective growth.

Under this circumstance, the carrier trap layer and the semi-insulating block layer have an etched mesa-structure.

In this case, each of the carrier trap layer and the semi-insulating block layer has an etching depth. Further, the semi-insulating block layer is formed on a substrate. Moreover, the etching depth reaches the semi-insulating block layer, and does not reach the substrate.

In this event, the semi-insulating block layer comprises a Fe-doped InP or a Ru-doped InP.

While, the carrier trap layer comprises a Si-doped InP or a Se-doped InP.

More specifically, it is unnecessary to etch the buried clad layer, and only the carrier trap layer is etched according to this invention. In consequence, the controllability of the required etching depth can be largely relieved.

Further, it is possible to accurately remain the semi-insulating semiconductor block layer of the bottom portion of the etching groove to reduce the parasitic capacitance caused by the electrode-wiring pattern.

Thereby, the optical semiconductor device, which has the low device capacitance and is suitable for the high-speed optical transmission, can be manufactured with the excellent repeatability.

Further, a small size optical communication module having the above-mentioned optical semiconductor device can be produced cheaply.

DESCRIPTION OF THE PREFERRED EMBODIMENTS

Figure 1:
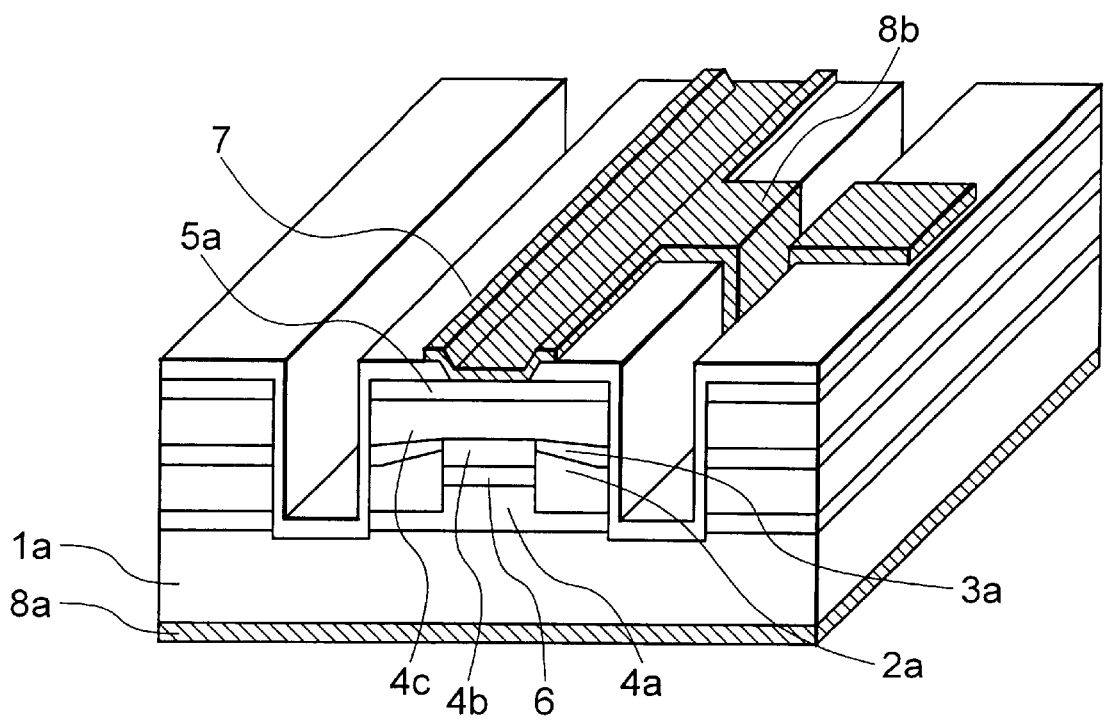
FIG. 1 is a diagram for explaining a first related art.
Figure 2:
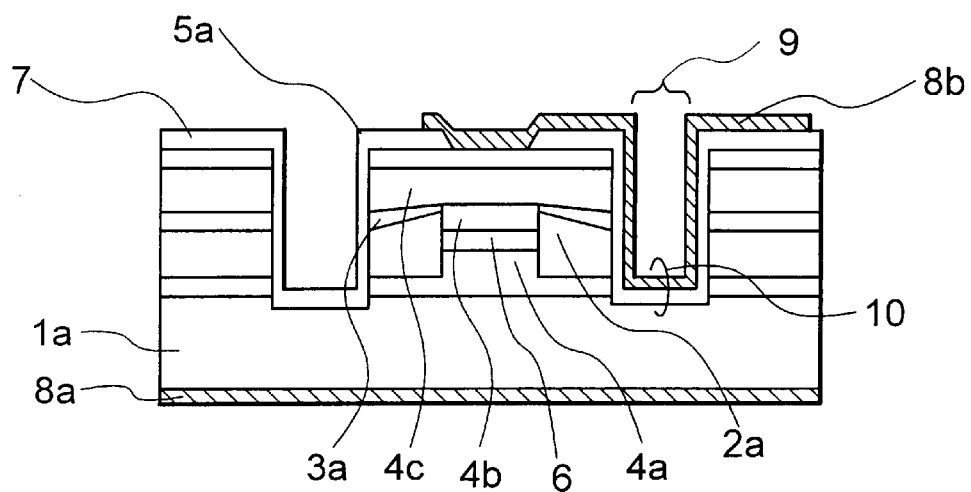
FIG. 2 is a cross sectional view for explaining a first related art.
Figure 3:
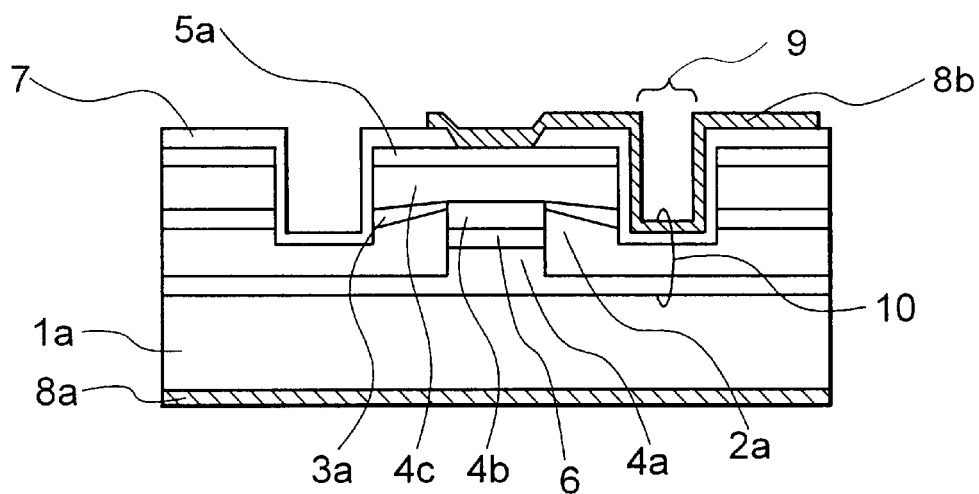
FIG. 3 is a cross sectional view for explaining a second related art.
Figure 4:
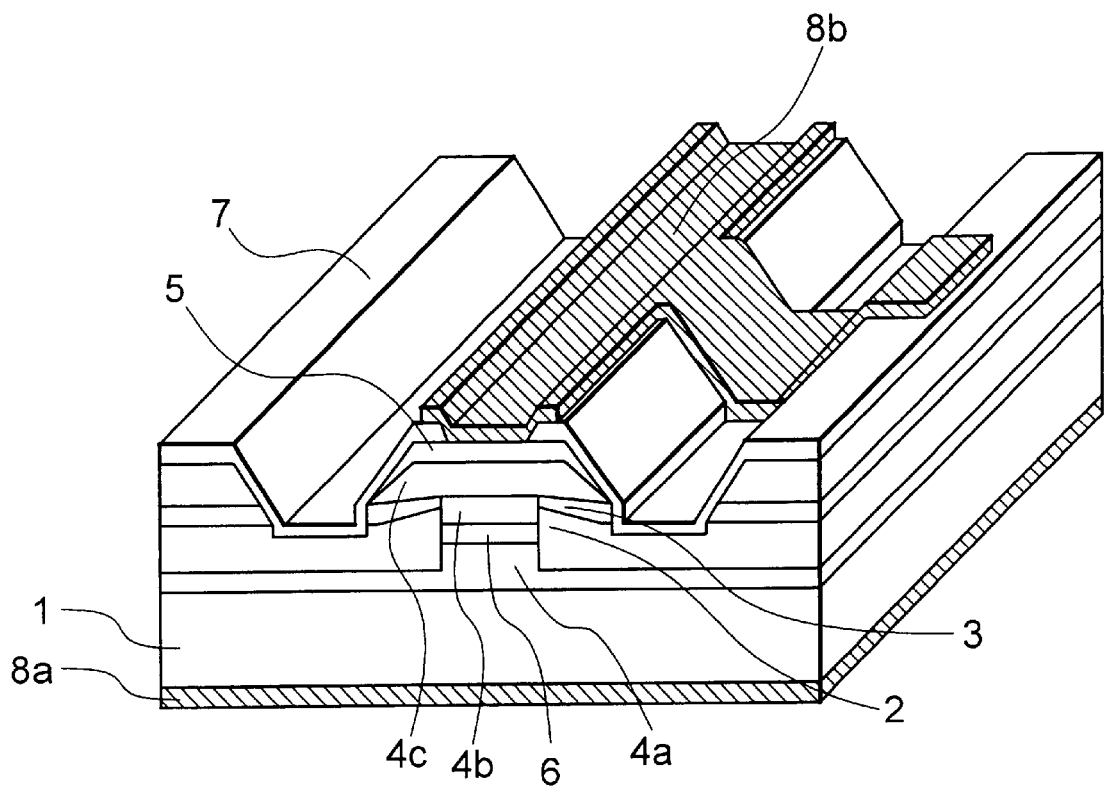
FIG. 4 is a diagram for explaining a first embodiment of this invention.

Referring to FIG. 4, description will be made about a first embodiment of this invention.

A buried clad layer 4c and a contact layer 5 are formed by a selective growth. Further, a carrier trap layer 3 and a semi-insulating block layer 2 are partially etched after the clad layer 4c and the contact layer 5 are formed.

Referring to FIGS. 5 through 10, description will be made about a method for manufacturing an FP-LD (Fabri-Perot Laser Diode) having an oscillating wavelength of 1.3 $\mu$m band as a first example of this invention.

Figure 5:
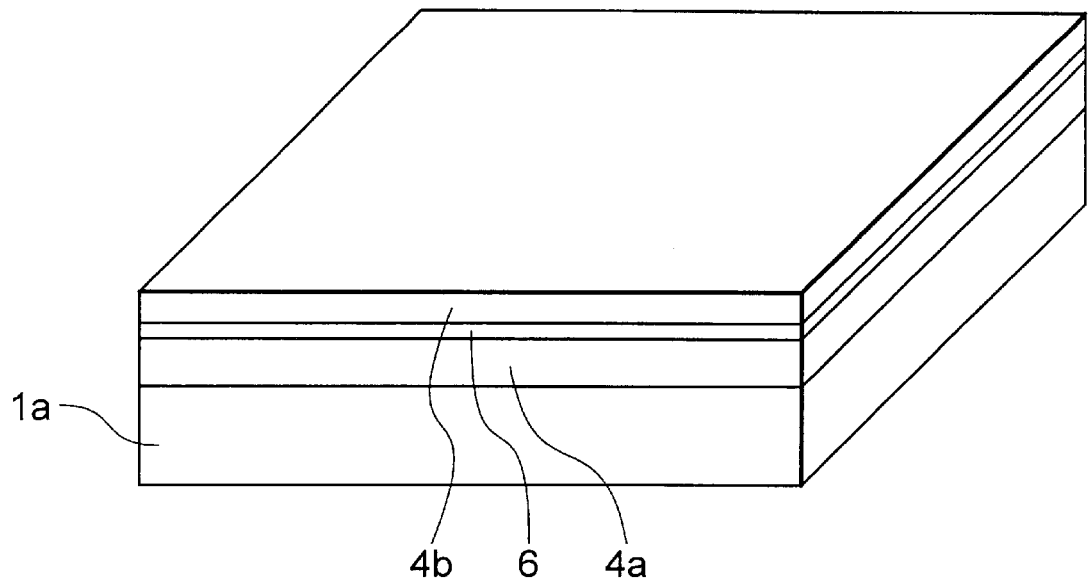
FIG. 5 is a diagram for explaining a first embodiment of this invention.

An n-InP clad layer 4a (thickness 0.2 $\mu$m, doping concentration: $1\times10^{18}$ cm$^3$), an active layer 6 having SCH (Separate Confinement Heterostructure) of InGaAsP and distortion MQW (Multi-Quantum Well) (quantum well number: 8, thickness: 0.2 $\mu$m, PL (photoluminescence) wavelength: 1.3 $\mu$m), and a p-InP clad layer 4b (thickness: 0.1 $\mu$m, doping concentration: $7\times10^{17}$ cm$^3$) are sequentially grown on an n-InP substrate 1a by the use of a MOVPE (Metal-Organic Vapor Phase Epitaxy) method, as illustrated in FIG. 5.

Figure 6:
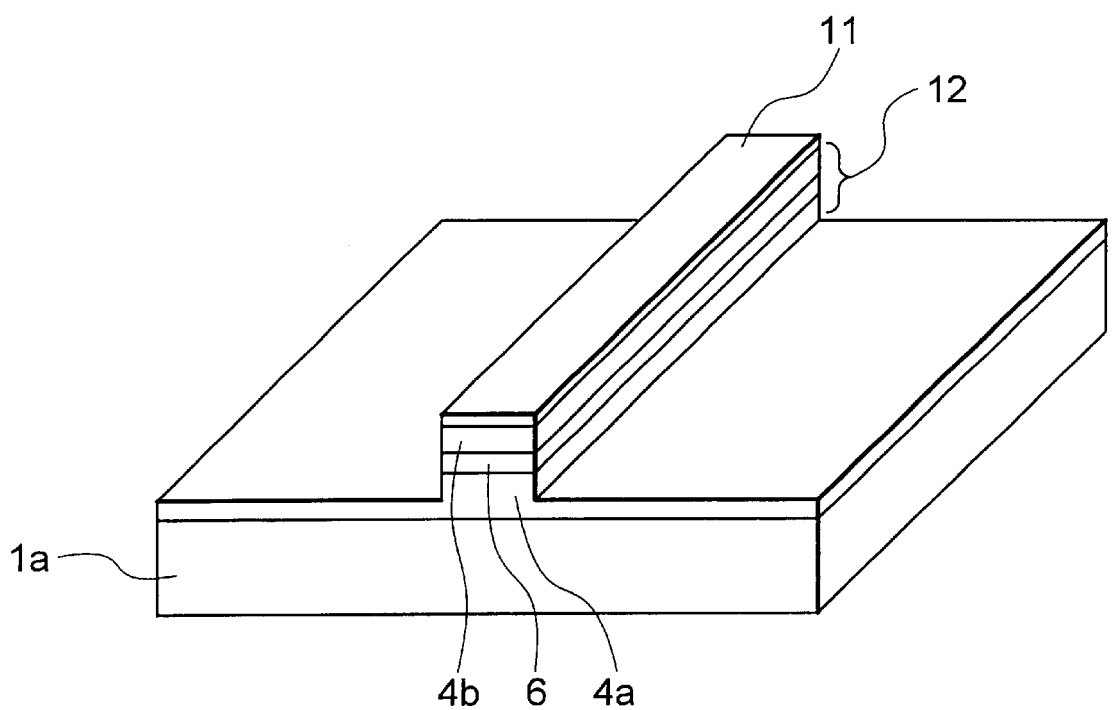
FIG. 6 is a diagram for explaining a first embodiment of this invention.

Successively, an SiO$_2$ stripe mask 11 (width: 1.6 $\mu$m) is formed on the p-InP clad layer 4b, and a mesa-stripe 12 having an active layer width of 1.6 $\mu$m is formed using the mask 11 by etching, as illustrated in FIG. 6.

Figure 7:
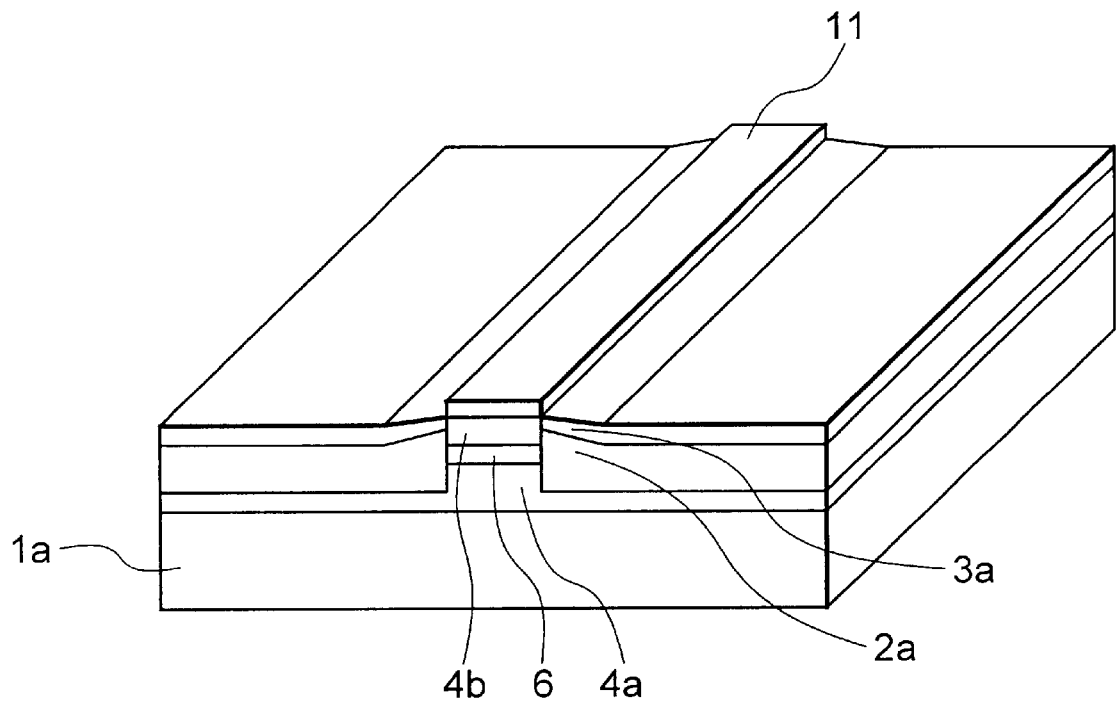
FIG. 7 is a diagram for explaining a first embodiment of this invention.

Further, an Fe-doped InP semi-insulating block layer 2a (thickness: 2.5 $\mu$m) and an Si-doped InP hole trap layer 3a (thickness: 0.5 $\mu$m, doping concentration: $3\times10^{18}$ cm$^3$) are formed by the use of the selective growth using the mask 11, as illustrated in FIG. 7.

Figure 8:
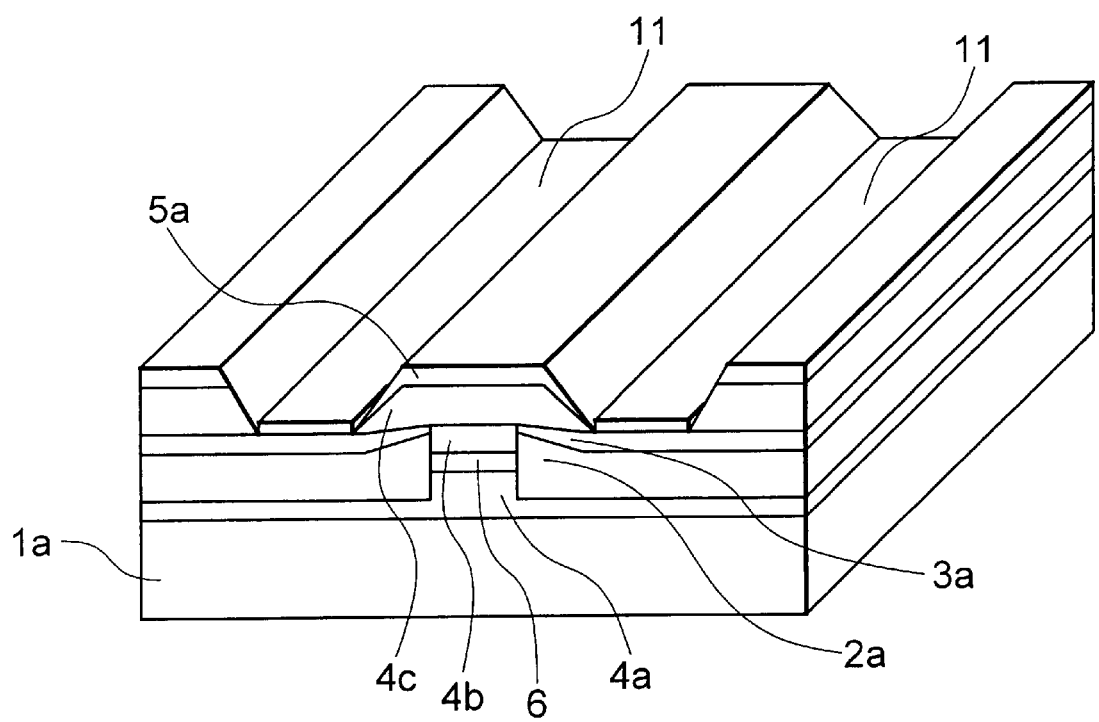
FIG. 8 is a diagram for explaining a first embodiment of this invention.

After the mask 11 is removed, a pair of SiO$_2$ stripe masks 11 (width: 8 $\mu$m, space: 5 $\mu$m) are formed, and a p-InP clad layer 4c (thickness: 1.5 $\mu$m, doping concentration: $1\times10^{18}$ cm$^3$) and a p-InGaAs contact layer 5a (thickness: 0.3 $\mu$m, doping concentration: $1\times10^{19}$ cm$^3$) are selectively grown using the masks 11, as illustrated in FIG. 8.

Successively, after the selective growth mask is removed, an SiO$_2$ mask stripe 11 having a width of 6 $\mu$m is formed so as to cover the mesa-stripe of the p-InP clad layer 4c and the p-InGaAs contact layer 5a.

Figure 9:
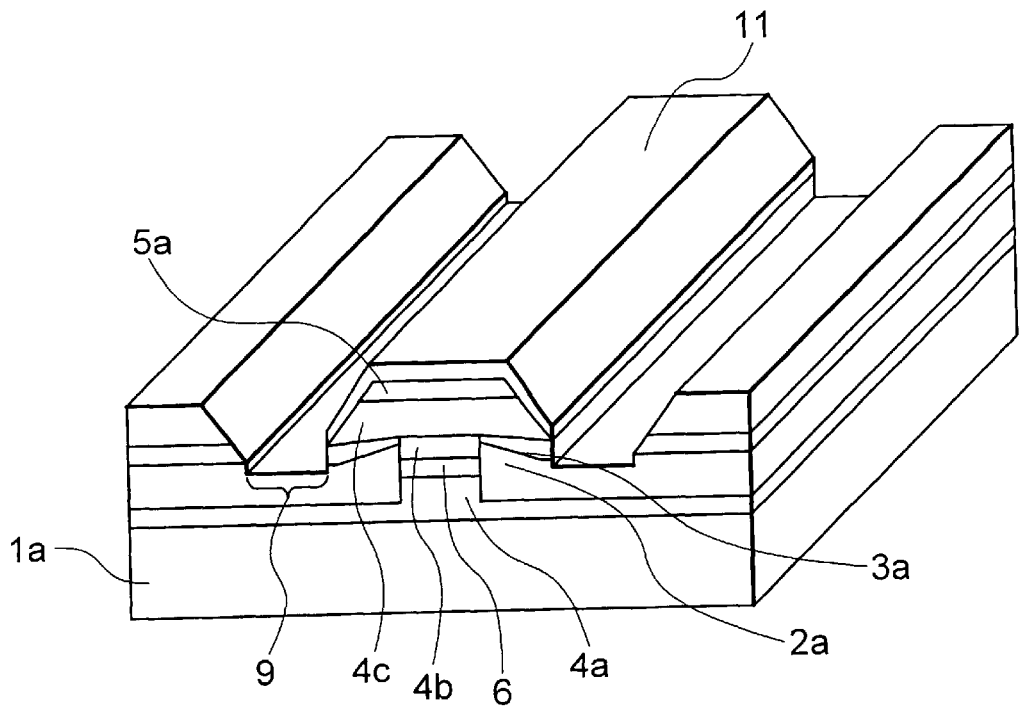
FIG. 9 is a diagram for explaining a first embodiment of this invention.

By the dry-etching using the mask stripe 11, the Si-doped InP hole trap layer 3a and the Fe-doped InP semi-insulating block layer 2a are partially removed, as illustrated in FIG. 9.

In this event, the hole trap layer 3a is completely severed to prevent an equivalent potential surface caused by the hole trap layer 3a being widened. Further, it is preferable that the thickness of the remaining semi-insulating block layer 2a is higher so as to suppress an increase of parasitic capacitance due to an electric wiring pattern. In consequence, the etching depth was substantially set to 0.7 $\mu$m.

Figure 10:
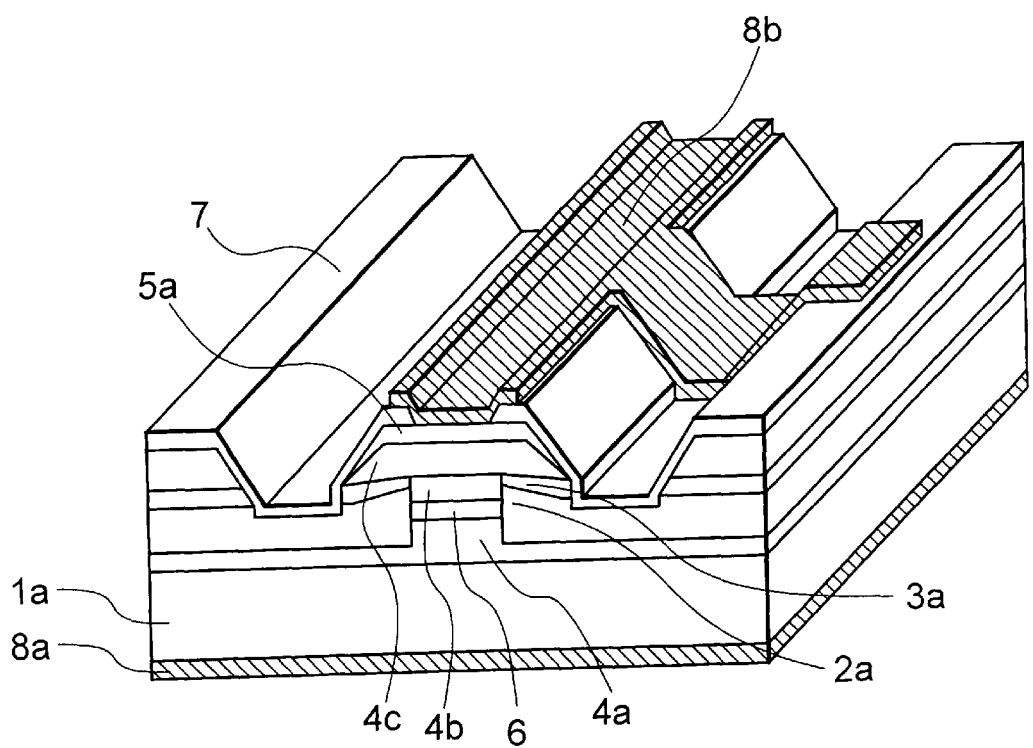
FIG. 10 is a diagram for explaining a first embodiment of this invention.

Moreover, after the etching mask 11 is removed, an SiO$_2$ insulating film 7 (thickness: 0.4 $\mu$m) is deposited. Thus, as illustrated in FIG. 10, the semiconductor laser having 1.3 $\mu$m band was obtained via an electrode contact opening formation step, an electrode formation step, a cleavage formation step, and an edge surface coating step.

The semiconductor laser having 1.3 $\mu$m band had the device capacitance of 0.5 pF in an resonator length of 250 $\mu$m, and 12 GHz in 3 dB band with respect to 70 mA drive, and thus, had excellent high-speed modulation characteristic.

Although the space of the SiO$_2$ stripe mask for performing the selective growth of the clad layer and the contact layer was set to 5 $\mu$m in the above-mentioned example, the space is preferably selected to 10 $\mu$m or less.

This is because the mask space is equal to the width of the mesa-bottom portion formed by the selective growth, and specifies the lower limit of the width of the carrier trap layer after the narrow mesa-formation step due to the partial etching of the subsequent carrier trap layer and the semi-insulating block layer.

In the meantime, when the stripe space is extremely narrow, the width of the selectively grown mesa-upper portion is formed to a trapezoid shape, and thereby, the electrode contact resistance becomes high. Consequently, the stripe space is desirably set to 3 μm or more.

Although the dry-etching was used as the partial etching of the carrier trap layer and the semi-insulating block layer, use may be made about wet-etching due to etchant of hydrogen bromide or bromine-methanol base or hydrochloric acid base or sulfuric acid base.

Figure 11:
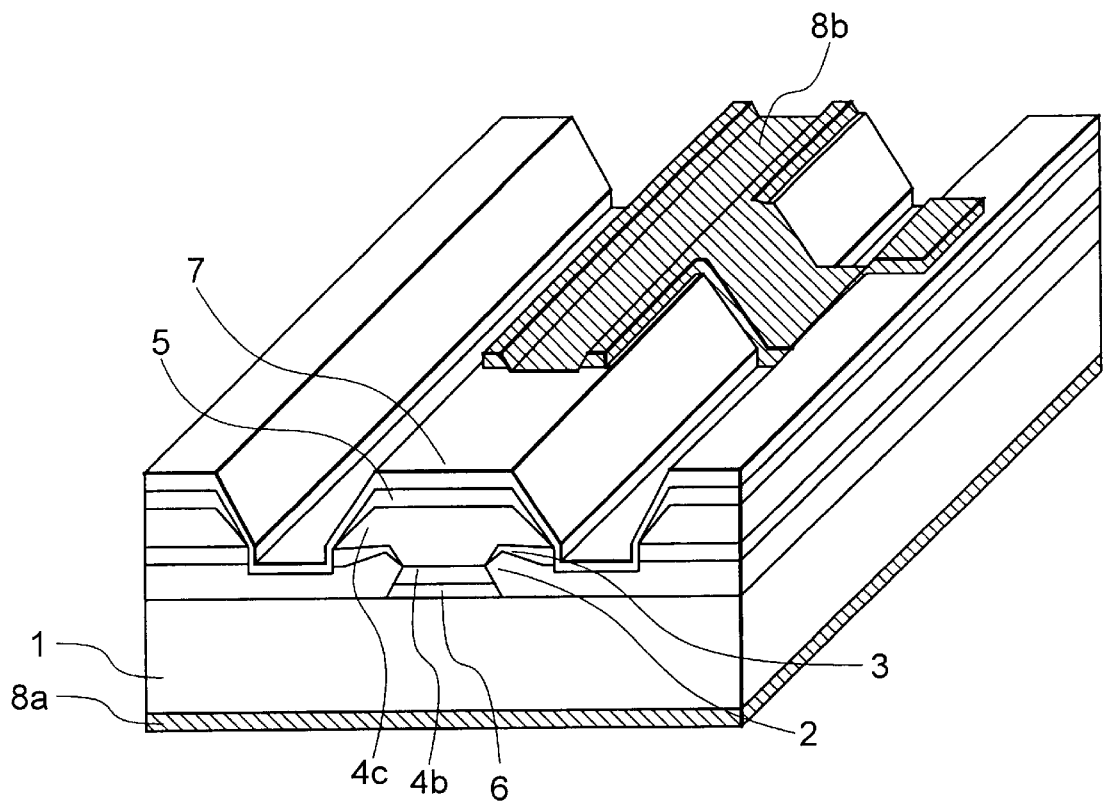
FIG. 11 is a diagram for explaining a second embodiment of this invention.

Referring to FIG. 11, description will be made about a second embodiment of this invention.

The clad layer 4c and the contact layer 5 are formed by the use of the selective growth, and the carrier trap layer 3 and the semi-insulating block layer 2 are partially etched by the use of the selective etching using the contact layer 5 as the etching mask.

Referring to FIGS. 12 through 17, description will be made about a method of manufacturing the optical semiconductor device according to the second embodiment.

In this embodiment, SSC (Spot-Size Converter) integrated DFB-LD (Distributed Feedback Laser Diode) having oscillating wavelength of 1.55 μm band was fabricated.

First, diffraction lattice 13 having a period of 240 nm is formed in a region 14 for forming a DFB-LD active layer on an n-InP substrate 1a by the use of the known EB (Electron Beam) exposure lithography.

Figure 12:
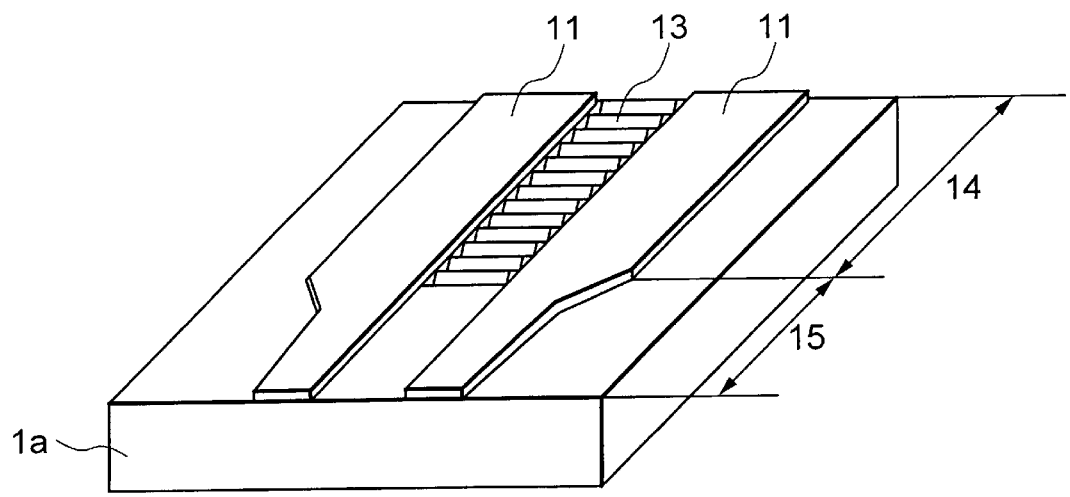
FIG. 12 is a diagram for explaining a second embodiment of this invention.

Successively, an $SiO_2$ mask 11 for growing an active layer and an SSC waveguide are formed by the use of the CVD method, and are patterned by the photolithography, as illustrated in FIG. 12.

Herein, it is to be noted that the $SiO_2$ mask 11 has an opening width of 1.6 μm. Further, a mask width is equal to 30 μm in a DFB-LD portion 14, and the mask width is made narrower towards the tip of the SSC portion 15.

Thereby, the SSC waveguide is formed such that the thickness of a waveguide core layer is gradually reduced.

Further, the DFB-LD portion 14 had the length of 300 μm while the SSC portion 15 had the length of 200 μm.

Figure 13:
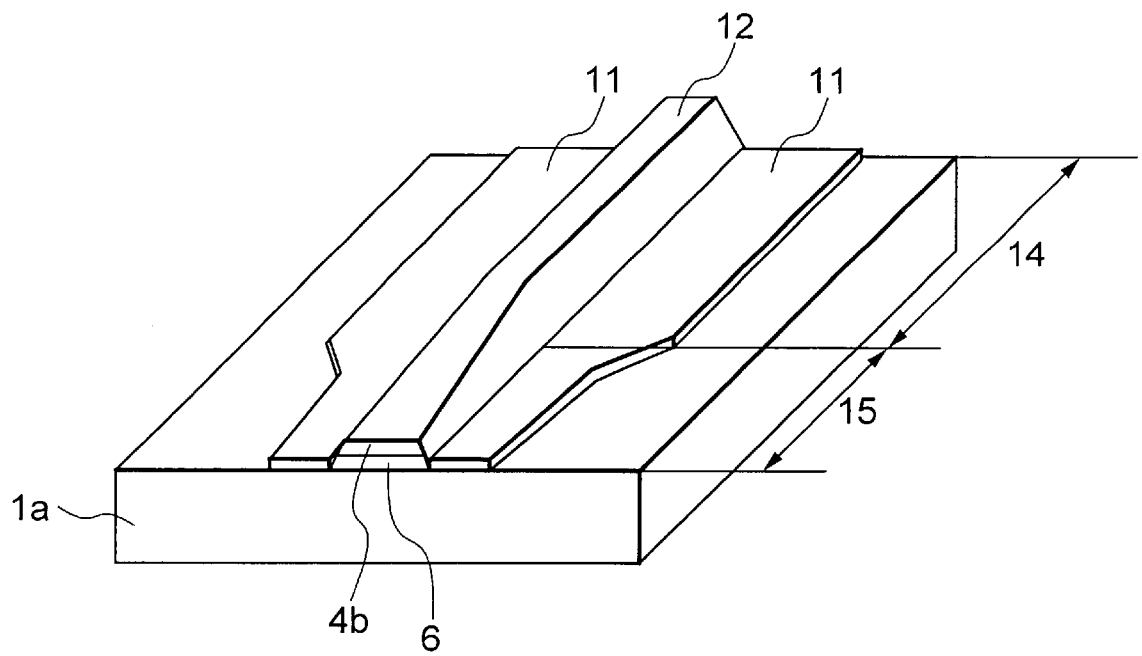
FIG. 13 is a diagram for explaining a second embodiment of this invention.

Thus, an active layer 6 (quantum well number: 6, thickness: 0.2 μm, PL wavelength: 1.56 82 m) having SCH of InAlGaAs and a distortion MQW structure, and a p-InP clad layer 4b (thickness: 0.1 μm, doping concentration: $5\times10^{17}$ $cm^3$) are formed by the selective MOVPE growth with the film thickness and composition in the opening stripe portion for growing the active layer on the substrate, on which the diffraction lattice 13 and the $SiO_2$ mask 11 are formed, as illustrated in FIG. 13.

Figure 14:
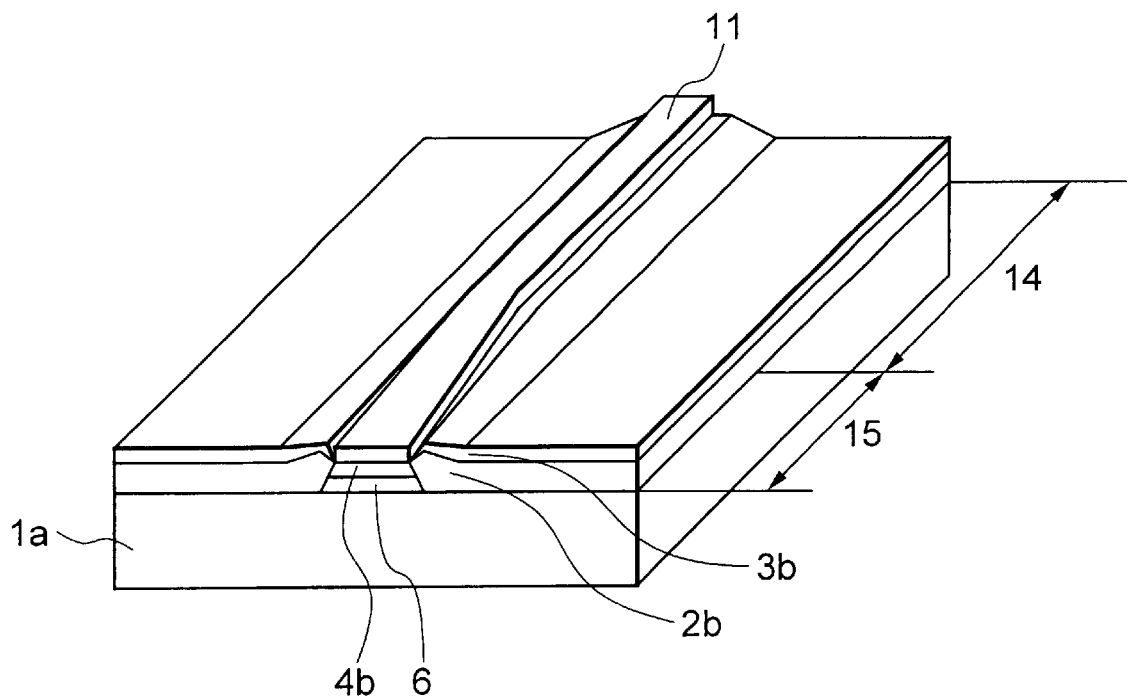
FIG. 14 is a diagram for explaining a second embodiment of this invention.

Subsequently, the $SiO_2$ mask 11 is formed for only an upper portion of a mesa-type optical waveguide including the active layer by the photolithography. Further, a Ru-doped semi-insulating block layer 2b (thickness: 1.3 μm) and a Se-doped InP hole trap layer 3b (thickness: 0.3 μm, doping concentration: $8\times10^{18}$ $cm^3$) are formed by the use of the selective growth using the mask 11, as illustrated in FIG. 14.

Figure 15:
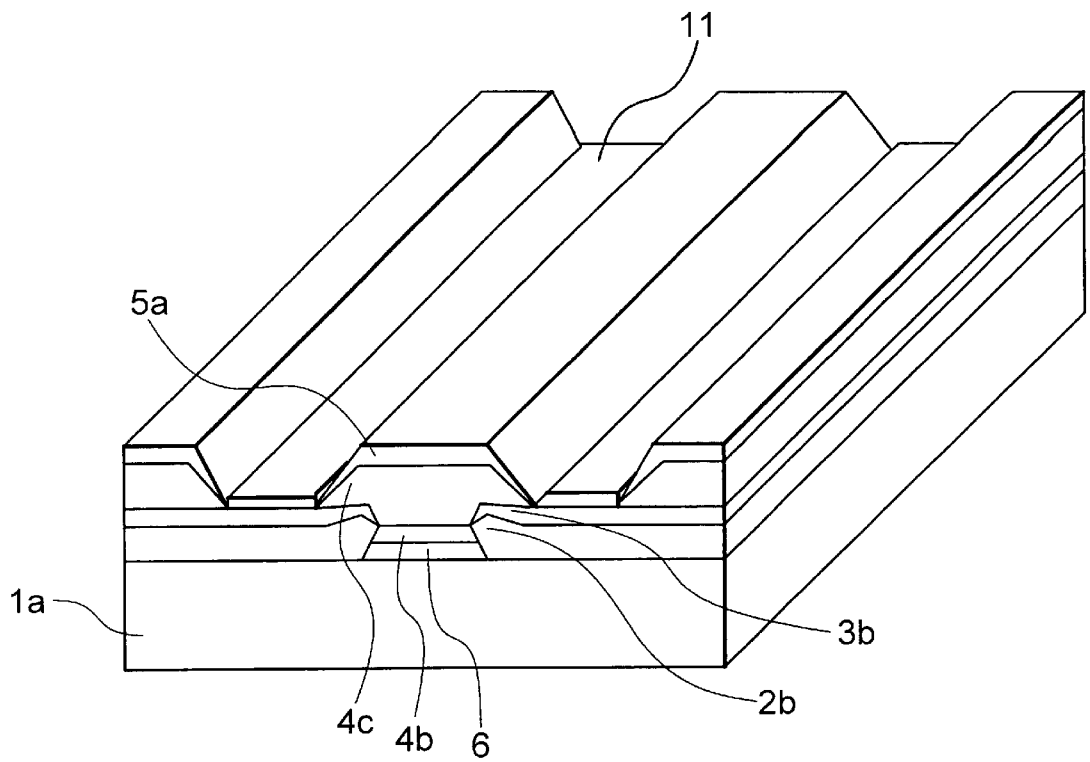
FIG. 15 is a diagram for explaining a second embodiment of this invention.

After the mask 11 is removed, a pair of $SiO_2$ stripe masks 11 (width: 12 μm, space: 8 μm) are formed, and a p-InP clad layer 4c (thickness: 4.0 μm, doping concentration: $1\times10^{18}$ $cm^3$) and a p-InGaA contact layer 5a (thickness: 0.3 μm, doping concentration: $8\times10^{18}$ $cm^3$) are selectively grown by using the mask 11, as illustrated in FIG. 15.

Successively, after the selective growth mask 11 is removed, the entire mesa is covered with the p-InGaAs contact layer 5a by the selective growth.

Figure 16:
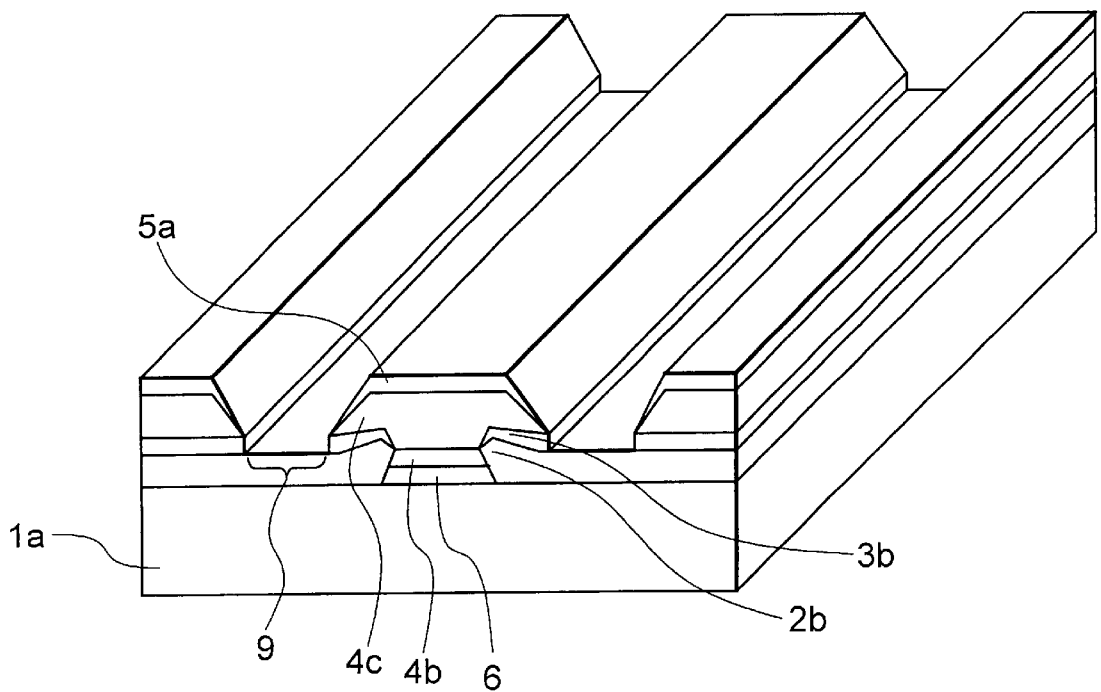
FIG. 16 is a diagram for explaining a second embodiment of this invention.

By using the contact layer 5a as the mask, the Se-doped InP carrier trap layer 3b and the Ru-doped InP semi-insulating block layer 2b are partially etched by using mixed solution of hydrochloric acid and acetic acid, as illustrated in FIG. 16. Herein, the mixed solution has sufficiently high etching rate for InP while it has low etching rate for InGaAs.

Under this circumstance, the etching depth was set to 0.4 μm to completely remove the carrier trap layer 3b and to sufficiently remain the thickness of the semi-insulating block layer 2b from the same reason as the first embodiment of this invention.

Figure 17:
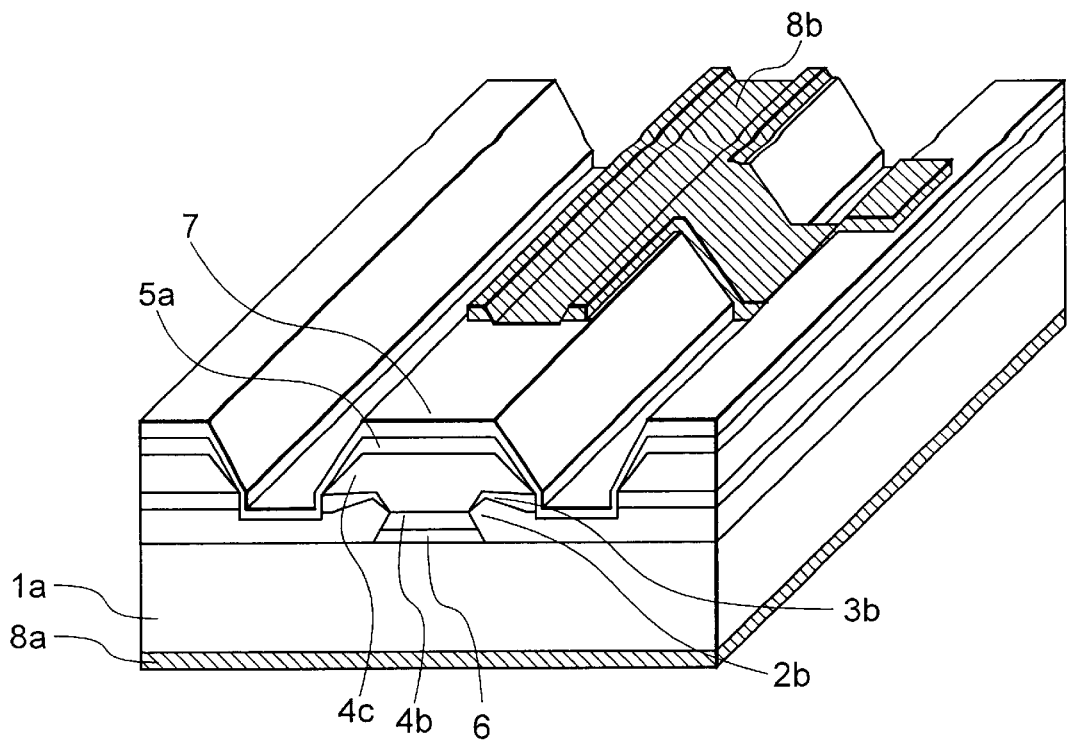
FIG. 17 is a diagram for explaining a second embodiment of this invention.

Subsequently, a SiN insulating film 7 (thickness: 0.3 μm) is deposited, and the SSC integrated DFB-LD having 1.55 μm band was obtained via the electrode contact opening formation step, an electrode formation step, the cleavage formation step, and the edge surface coating step, as illustrated in FIG. 17.

The SSC integrated DFB-LD oscillates with wavelength of 1.552 μm determined by effective index of refraction and diffraction lattice period of the DFB-LD portion, and had the device capacitance of 0.8 pF and 11 GHz in 3 dB band with respect to 70 mA drive. Thus, the DFB-LD had excellent high-speed modulation characteristic.

Although the mixed solution of hydrochloric acid and acetic acid was used as the selective etchant in this example, the hydrochloric acid itself or mixed solution of hydrochloric acid and phosphoric acid can be used as the selective etchant. Namely, the used etchant is not restricted to the material used in this example.

Figure 18:
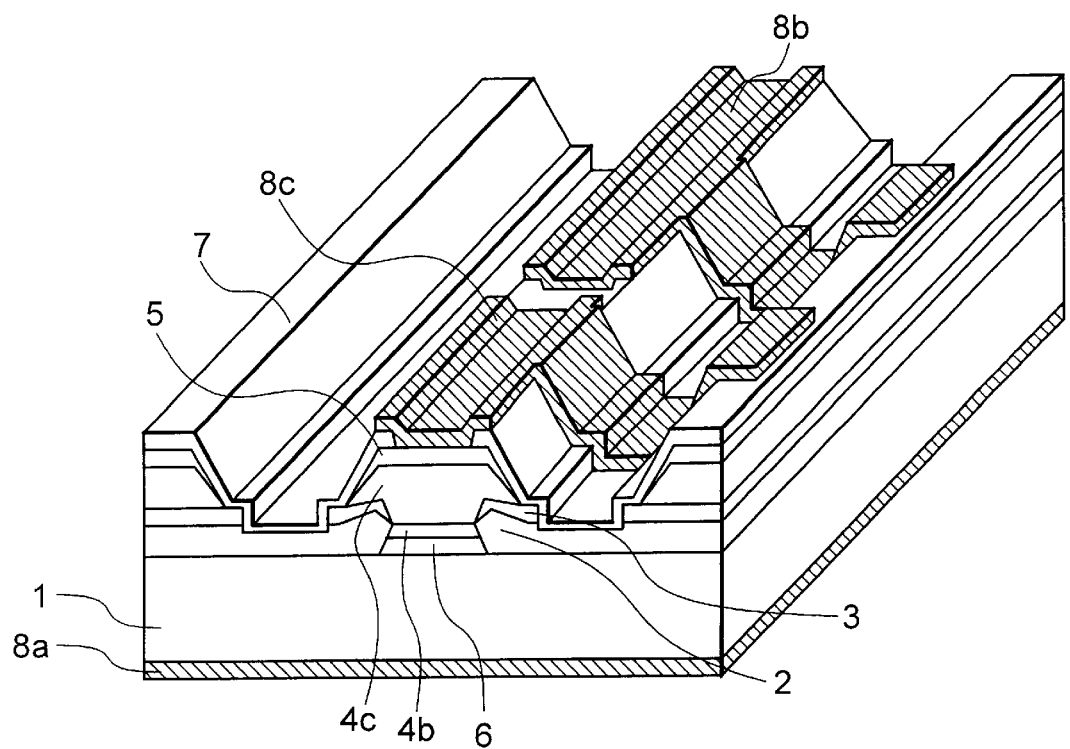
FIG. 18 is a diagram for explaining a third embodiment of this invention.

Referring to FIG. 18, description will be made about the optical semiconductor device according to a third embodiment of this invention.

The clad layer 4c and the contact layer 5 are formed by the use of the selective growth, and the carrier trap layer 3 and the semi-insulating block layer 2 are partially etched before the clad layer 4c and the contact layer 5 are selectively grown.

Referring to FIGS. 19 through 24, description will be made about a method of manufacturing the optical semiconductor device according to the third embodiment.

In this embodiment, an EA (Electroabsorption) modulator integrated DFB-LD having 1.58 μm band was fabricated as follows.

First, diffraction lattice having a period of 242 nm is formed in a region 14 for forming a DFB-LD active layer on an n-InP substrate 1a by the use of the EB (Electron Beam) exposure lithography.

Figure 19:
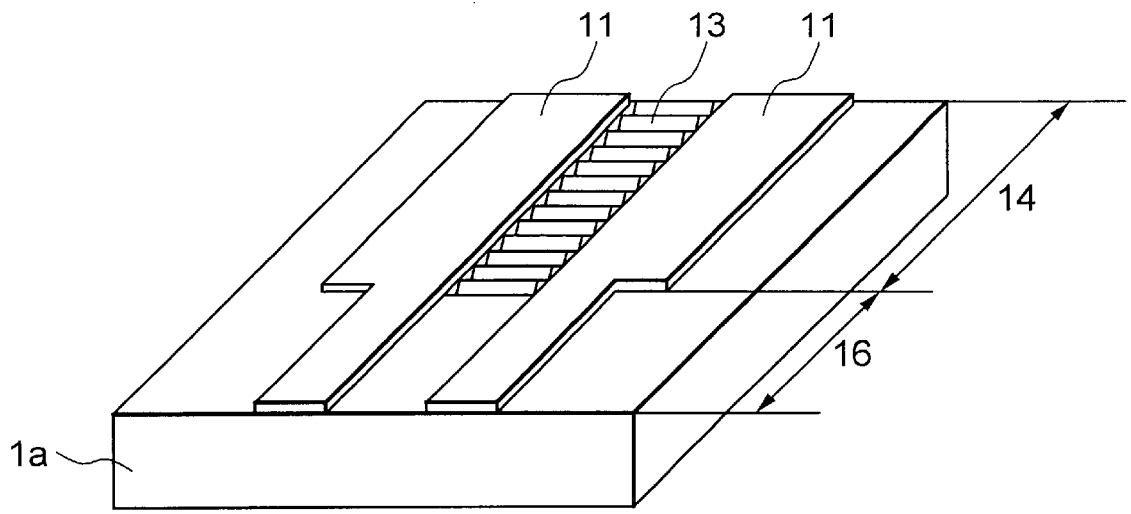
FIG. 19 is a diagram for explaining a third embodiment of this invention.

Successively, an $SiO_2$ mask for selectively growing an active layer of a DFB-LD portion 14 and an absorption layer of an EA modulator portion 16 is deposited by the use of the CVD method, and is patterned by the photolithography, as illustrated in FIG. 19.

In this case, the $SiO_2$ mask 11 for growing the active layer of the DFB-LD portion 14 and the absorption layer of the EA modulator portion 16 has an opening width of 1.7 μm. Further, a mask width is equal to 20 μm in a DFB-LD portion 14 while it is equal to 12 μm in the EA modulator absorption layer.

Thereby, quantum level wavelength when electrical field is not applied for the EA modulator absorption layer becomes shorter than oscillating wavelength of the DFB-LD portion 14.

Figure 20:
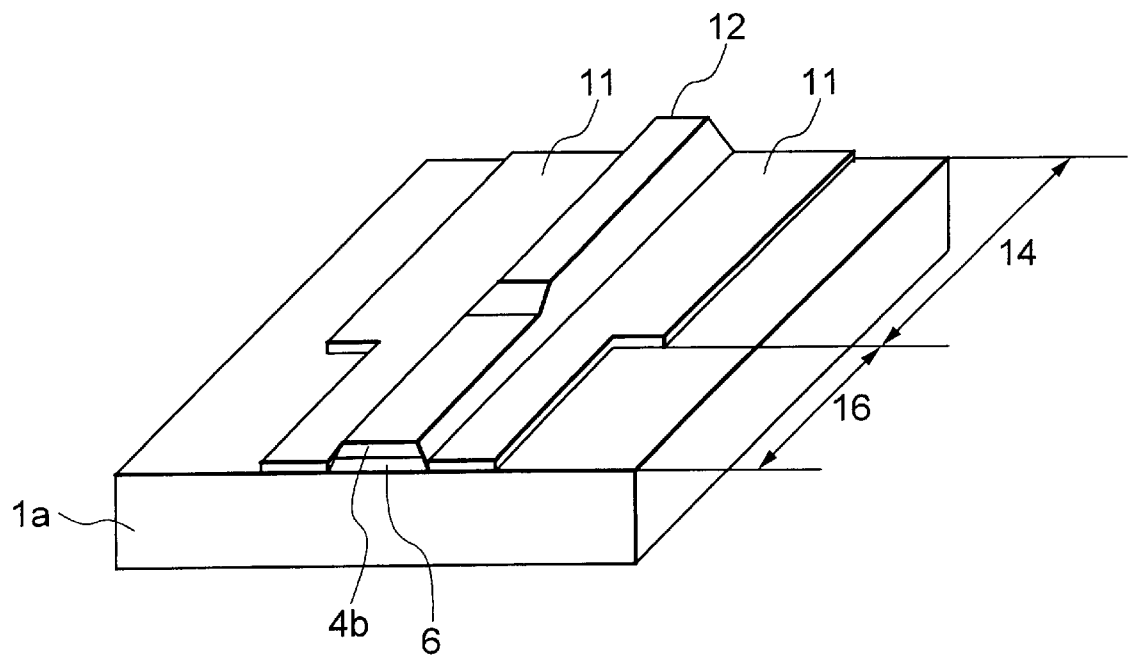
FIG. 20 is a diagram for explaining a third embodiment of this invention.

Thus, an active layer 6 (quantum well number: 8, thickness: 0.24 μm, PL wavelength: 1.59 μm) having SCH of InAlGaAs and a distortion MQW structure, and a p-InP clad layer 4b (thickness: 0.1 μm, doping concentration: $5 \times 10^{17}$ cm$^3$) are formed by the selective MOVPE growth with the film thickness and composition in the opening stripe portion for growing the DFB-LD active layer on the substrate 1a, on which the diffraction lattice 13 and the SiO$_2$ mask 11 are formed, as illustrated in FIG. 20.

Figure 21:
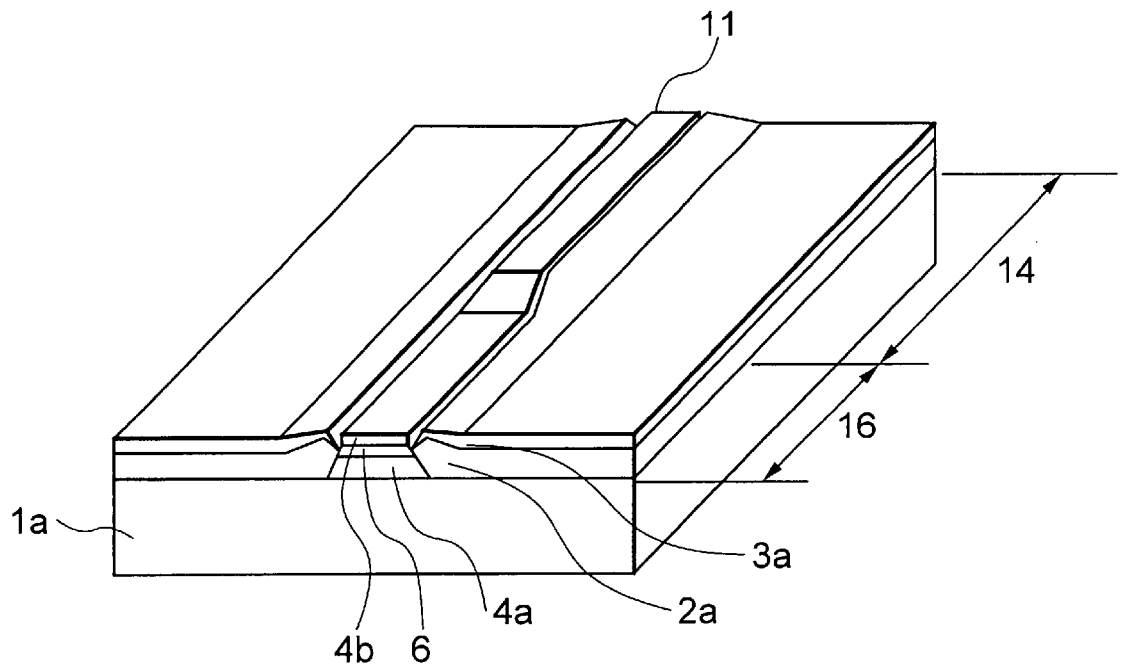
FIG. 21 is a diagram for explaining a third embodiment of this invention.

Subsequently, the SiO$_2$ mask 11 is formed for only an upper portion of a mesa-type optical waveguide including the active layer 6 and the absorption layer by the photolithography, and a Fe-doped InP semi-insulating block layer 2a (thickness: 1.0 μm) and an Si-doped InP hole trap layer 3a (thickness: 0.2 μm, doping concentration: $7 \times 10^{18}$ cm$^3$) are formed by the use of the selective growth using the mask 11, as illustrated in FIG. 21.

Figure 22:
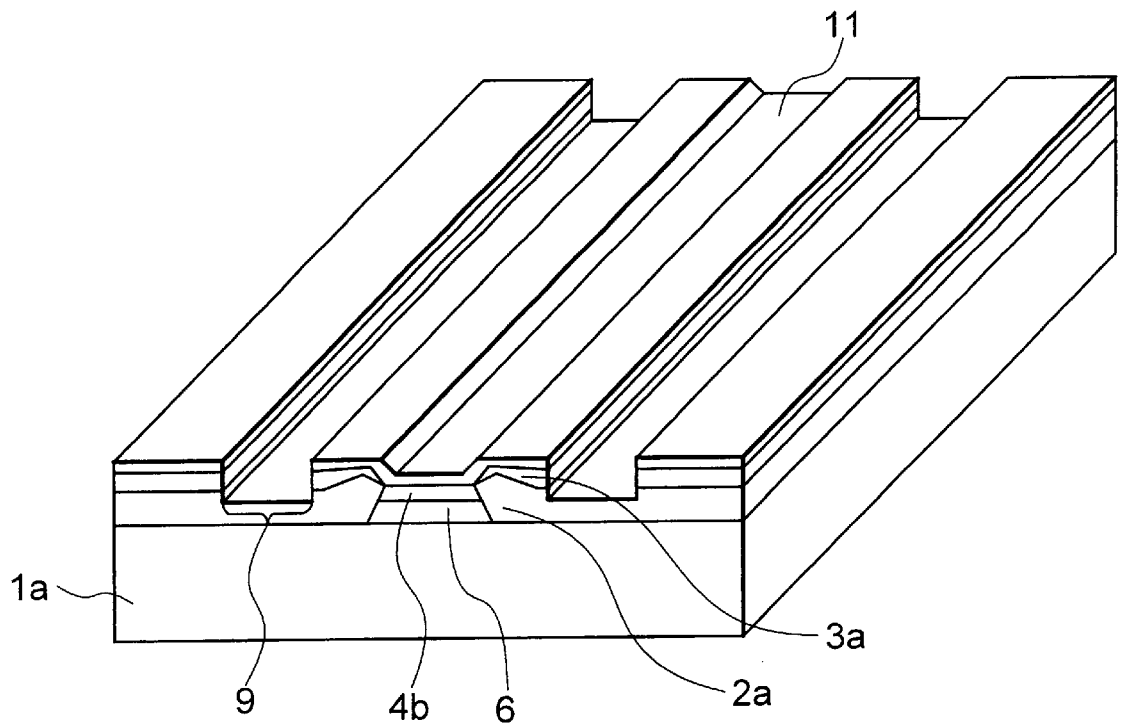
FIG. 22 is a diagram for explaining a third embodiment of this invention.

After the mask 11 is removed, an SiO$_2$ stripe masks 11 having a width of 5 μm are formed so as to cover the mesa-stripe of the p-InP clad layer and the p-InGaAs contact layer. By the dry-etching using the mask 11, the Si-doped InP hole trap layer 3a and the Fe-doped InP semi-insulating block layer 2a are partially removed, as illustrated in FIG. 22.

In this event, the etching depth was set to 0.3 μm so as to completely remove the carrier trap layer 3a and to sufficiently remain the thickness of the semi-insulating block layer 2a from the same reason as the second embodiment of this invention.

Figure 23:
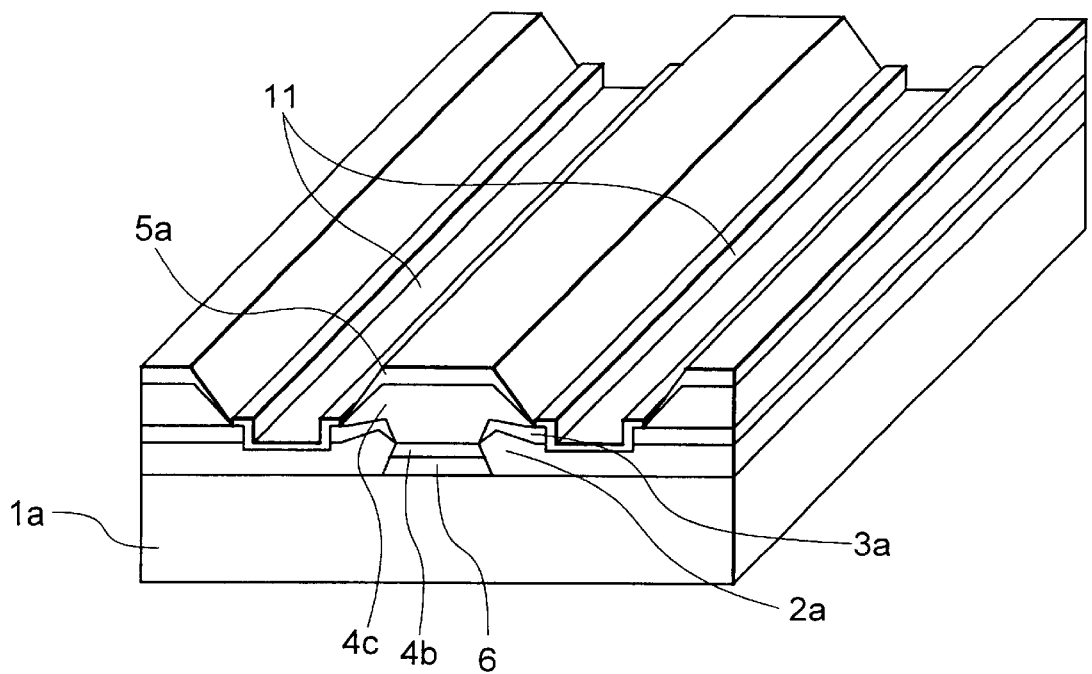
FIG. 23 is a diagram for explaining a third embodiment of this invention.

After the mask 11 is removed, a pair of SiO$_2$ stripe masks 11 (width: 8 μm, space: 4 μm) are formed, and a p-InP clad layer 4c (thickness: 1.5 μm, doping concentration: $7 \times 10^{17}$ cm$^3$) and a p-InGaAs contact layer 5a (thickness: 0.3 μm, doping concentration: $7 \times 10^{18}$ cm$^3$) are selectively grown by using the mask 11, as illustrated in FIG. 23.

Figure 24:
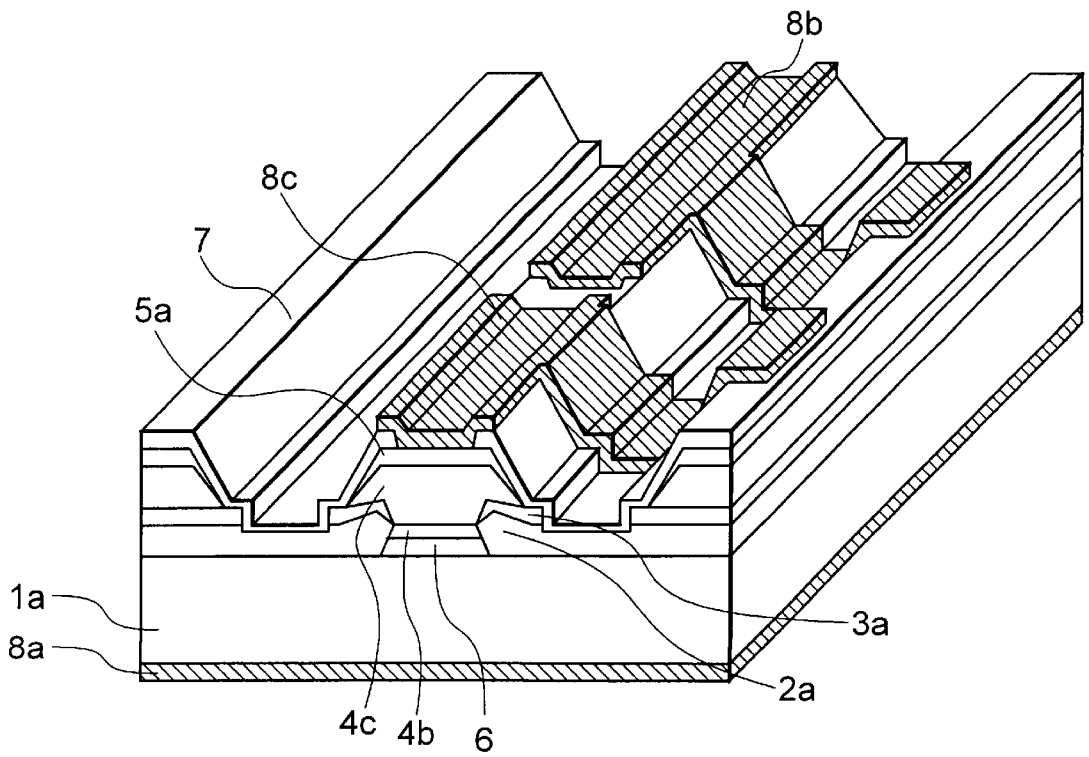
FIG. 24 is a diagram for explaining a third embodiment of this invention.

Subsequently, an SiO$_2$ insulating film 7 (thickness: 0.6 μm) is deposited, and the EA modulator integrated DFB-LD having 1.58 μm band was obtained via the electrode contact opening formation step, an electrode formation step, the cleavage formation step, and the edge surface coating step, as illustrated in FIG. 24.

The EA modulator integrated DFB-LD oscillates with wavelength of 1.581 μm determined by effective index of refraction and diffraction lattice period of the DFB-LD portion.

Further, the DFB-LD had the device capacitance of 0.4 pF in the modulator portion having the length of 200 μm and 16 GHz in 3 dB band. Thus, the DFB-LD had excellent high-speed modulation characteristic.

Figure 25:
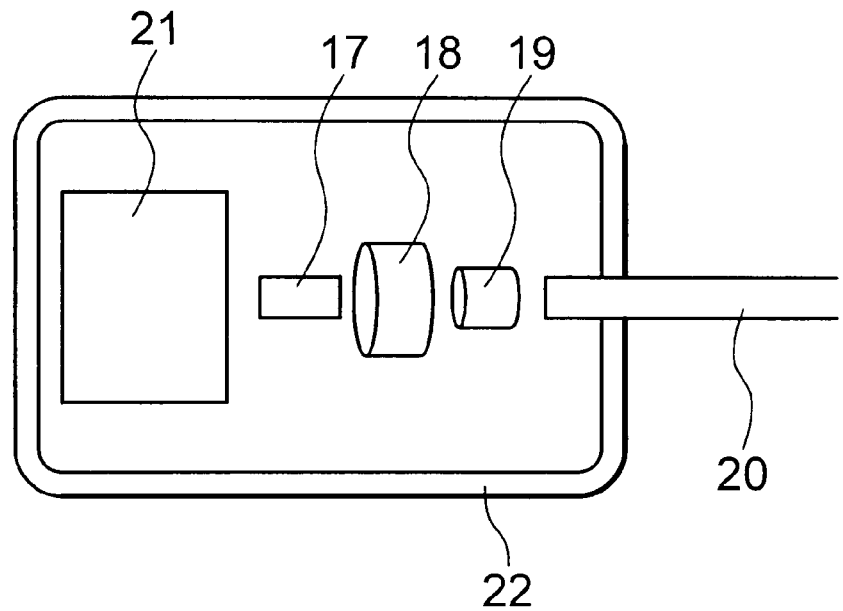
FIG. 25 is a diagram for explaining a fourth embodiment of this invention.

Referring to FIG. 25, description will be made about a fourth embodiment of this invention.

A transmitting module 22 for the optical communication includes an electric interface 21 for driving the EA optical modulator integrated DFB-LD 17. With such a structure, an output light beam from the EA optical modulator integrated DFB-LD 17 is given to an optical fiber 20 via an aspheric surface lens 18 and an optical isolator 19.

By using the module 22, a high-speed optical transmission signal can be readily produced. This is because the optical semiconductor device according to this invention is superior in the high-speed modulation characteristic.

Figure 26:
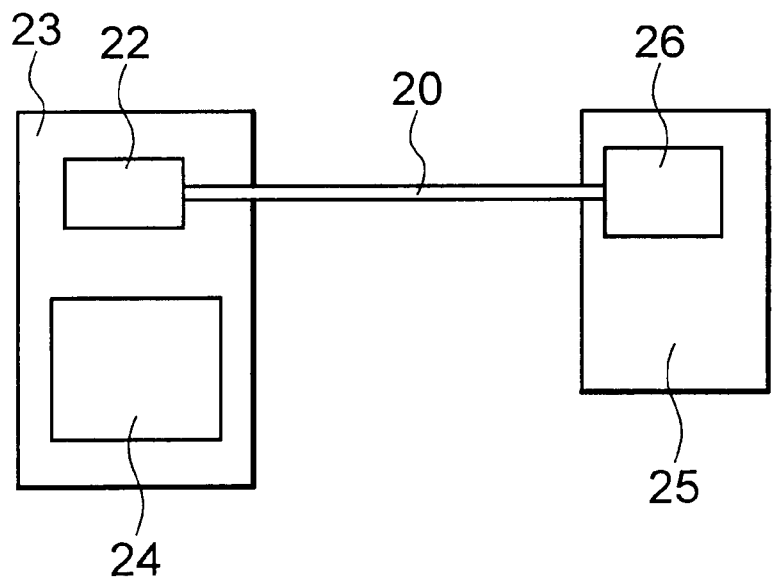
FIG. 26 is a diagram for explaining a fifth embodiment of this invention.

Referring to FIG. 26, description will be made about a fifth embodiment of this invention.

In the fifth embodiment, an optical communication system utilizes the optical transmission module 22 according to the fourth embodiment.

An optical transmitting apparatus 23 includes the optical transmitting module 22 and a drive system 24 for driving the optical transmitting module 22.

With this structure, a signal light beam produced from the optical transmitting device 22 is transmitted via the optical fiber 20, and is detected by a receiving module 26 placed in a receiving apparatus 25.

By using the optical communication system according to this embodiment, the high-speed transmission of 2.5 Gb/S or 10 Gb/S or higher can be readily realized.

This is because the optical transmitting module according to this invention has an excellent high-speed modulation characteristic, and an excellent optical transmission waveform can be obtained at rising and falling.

As mentioned above, description has been made about the FP-LD as the example of the first embodiment. The FP-LD has the clad layer and the contact layer formed by the selective growth. In the FP-LD, the carrier trap layer and the semi-insulating block layer are partially etched after the clad layer and the contact layer are formed.

Further, description has been made about the SSC-DF-BLD as the example of the second embodiment. In the SSC-DF-BLD, the carrier trap layer and the semi-insulating block layer are partially etched by the selective growth to form the contact layer. The selective etching is carried out by using the contact layer as the etching mask.

Moreover, description has been made about the EA modulator integrated DFB-LD as the example of the third embodiment. In the EA modulator integrated DFB-LD, the carrier trap layer and the semi-insulating block layer are partially etched before the clad layer and the contact layer are selectively grown.

However, the optical semiconductor device as the respective embodiments is not restricted to the above-mentioned types, and is applicable for the other types of optical semiconductor devices, an optical module, and an optical transmitting device, such as, the DFB-LD or the EA modulator itself, a semiconductor optical amplifying device, and an optical gate switch device.

Although the InGaAsP/InP based material and the InYAlGaAsP type are used, and the n-InP substrate is used in the above-described examples, the material base and the conductive type of the substrate are not restricted to these examples.

For example, use may be made of material base, such as, a GaInNAs/GaAs base, an AlGaAs/GaAs base, and AsGaInP/GaInP base. Further, use may be made of a p-type or a semi-insulating substrate.

The mask or the insulating film material used in the crystal growth method or the selective growth is not restricted to the above-mentioned examples.

For example, even when use may be made about any method and material, such as, the MBE (Molecular Beam Epitaxy) method as the crystal growth method, and SiNx as the selective growth mask, this invention is applicable for the semiconductor device having the semi-insulating buried structure including the carrier trap layer and the optical transmitting module.

What is claimed is:
1. An optical semiconductor device, comprising:
   a buried hetero structure with an active layer;
   a semi-insulating semiconductor block layer contacting sides of said hetero structure;
   a carrier trap layer on said semi-insulating semiconductor block layer and contacting the sides of said hetero structure, said semi-insulating semiconductor block layer and said carrier trap layer defining a mesa with said hetero structure at a core thereof, a top of said mesa having a first lateral dimension;

a clad layer on said mesa atop said hetero structure and said carrier trap layer; and a contact layer on said mesa atop said clad layer, said clad layer and said contact layer having sides that define a second lateral dimension that is smaller than said first lateral dimension.

2. The device of claim 1, wherein said sides of said clad layer and said contact layer that define said second lateral dimension slope towards each other.

3. The device of claim 1, wherein said clad layer and said contact layer define a trapezoid in vertical cross section, a longer one of parallel sides of said trapezoid being said first lateral dimension and a shorter one of the parallel sides of said trapezoid being said second lateral dimension.

4. The device of claim 1, wherein said semi-insulating semiconductor block layer has a bottom portion that extends laterally beyond said first lateral dimension.

5. The device as claimed in claim 1, wherein:

the semi-insulating block layer comprises a Fe-doped InP.

6. The device as claimed in claim 1, wherein:

the semi-insulating block layer comprises a Ru-doped InP.

7. The device as claimed in claim 1, wherein:

the carrier trap layer comprises a Si-doped InP.

8. The device as claimed in claim 1, wherein:

the carrier trap layer comprises a Se-doped InP.

9. An optical semiconductor device, comprising:

a substrate;

a buried hetero structure on said substrate, said hetero structure having an active layer;

a semi-insulating semiconductor block layer on said substrate and contacting sides of said hetero structure;

a carrier trap layer on said semi-insulating semiconductor block layer and contacting the sides of said hetero structure, said semi-insulating semiconductor block layer and said carrier trap layer defining a mesa with said hetero structure at a core thereof, a top of said mesa having a first lateral dimension, said semi-insulating semiconductor block layer having a bottom portion that extends laterally beyond said first lateral dimension;

a grown clad layer on said mesa atop said hetero structure and said carrier trap layer; and a grown contact layer on said mesa atop said clad layer, said clad layer and said contact layer having unetched sides that slope towards each other to define a second lateral dimension that is smaller than said first lateral dimension.

10. The device of claim 9, wherein said clad layer and said contact layer define a trapezoid in vertical cross section, a longer one of parallel sides said trapezoid being said first lateral dimension and a shorter one of the parallel sides of said trapezoid being said second lateral dimension.

* * * * *